United States Patent
Connor et al.

(10) Patent No.: US 12,432,979 B2
(45) Date of Patent: Sep. 30, 2025

(54) GATE DIELECTRIC FOR THIN FILM OXIDE TRANSISTORS

(71) Applicant: Intel Corporation, Santa Clara, CA (US)

(72) Inventors: Christopher Connor, Hillsboro, OR (US); James O'Donnell, Forest Grove, OR (US); Shailesh Kumar Madisetti, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 869 days.

(21) Appl. No.: 17/476,165

(22) Filed: Sep. 15, 2021

(65) Prior Publication Data

US 2023/0080212 A1    Mar. 16, 2023

(51) Int. Cl.
*H10D 30/67* (2025.01)
*H10D 30/01* (2025.01)
(Continued)

(52) U.S. Cl.
CPC ..... *H10D 30/6755* (2025.01); *H10D 30/6757* (2025.01); *H10D 99/00* (2025.01);
(Continued)

(58) Field of Classification Search
CPC ........... H10D 30/6755; H10D 30/6757; H10D 30/6728; H10D 30/0278; H10D 30/031;
(Continued)

(56) References Cited

U.S. PATENT DOCUMENTS 9,887,297 B2 * 2/2018 Tanaka ................... H10D 86/60
10,937,897 B2 * 3/2021 Yamazaki ............. H10D 99/00
(Continued)

FOREIGN PATENT DOCUMENTS

CN    113299759 A    8/2021
CN    113380899 A    9/2021

OTHER PUBLICATIONS

Li, et al., "A Ferroelectric Thin Film Transistor Based on Annealing-Free HfZrO Film," IEEE Journal of the Electron Devices Society, vol. 5, No. 5, Sep. 2017. pp. 378-383.
(Continued)

*Primary Examiner* — Jeff W Natalini
*Assistant Examiner* — Andrew Zabel
(74) *Attorney, Agent, or Firm* — Finch & Maloney PLLC (57) ABSTRACT

A thin film transistor (TFT) structure. In an example, the TFT includes a gate electrode, a first layer comprising an oxide semiconductor material, and a second layer between the first layer and the gate electrode. The second layer is crystalline and is in contact with the first layer, and includes zirconium and oxygen. The TFT includes a first contact coupled to the first layer at a first location, and a second contact coupled to the first layer at a second location. In some cases, the second layer further includes hafnium. In some cases, the TFT includes a third layer between of the gate electrode and the second layer, the third layer comprising a metal and oxygen. The gate electrode may also include the metal. In some cases, hydrogen is present at an interface between the gate electrode and the second layer.

20 Claims, 9 Drawing Sheets (51) Int. Cl.
*H10D 99/00* (2025.01)
*H01L 21/77* (2017.01)

(52) U.S. Cl.
CPC .......... *H01L 21/77* (2013.01); *H10D 30/0278* (2025.01); *H10D 30/6728* (2025.01)

(58) Field of Classification Search
CPC ............... H10D 30/017; H10D 30/019; H10D 30/0191; H10D 30/0193; H10D 30/0194; H10D 30/0195; H10D 30/0196; H10D 30/0197; H10D 30/0198; H10D 30/0312; H10D 30/0318; H10D 30/0321; H10D 30/0323; H10D 30/0327; H10D 30/67; H10D 30/6758; H10D 30/6704; H10D 30/6706; H10D 30/6708; H10D 30/6711; H10D 30/6713; H10D 30/6715; H10D 30/6717; H10D 30/6719; H10D 30/6721; H10D 30/6723; H10D 30/6725; H10D 30/6727; H10D 30/674; H10D 30/6733; H10D 30/501; H10D 30/502; H10D 30/503; H10D 30/504; H10D 30/506; H10D 30/507; H10D 30/508; H10D 30/509; H10D 30/6734; H10D 30/6743; H10D 30/6744; H10D 30/6759; H10D 30/6746; H10D 30/6731; H10D 30/6732; H10D 30/6745; H10D 30/675; H10D 30/6741; H10D 30/481; H10D 30/485; H10D 30/6748; H10D 30/6756; H10D 86/00; H10D 86/201; H10D 87/00; H10D 86/215; H10D 86/40; H10D 86/60; H10D 86/411; H10D 86/421; H10D 86/423; H10D 86/425; H10D 86/427; H10D 86/431; H10D 86/441; H10D 86/443; H10D 86/451; H10D 86/471; H10D 86/481; H10D 86/021; H10D 86/0212; H10D 86/0214; H10D 86/0221; H10D 86/0223; H10D 86/0225; H10D 86/0227; H10D 86/0229; H10D 86/0231; H10D 86/0241; H10D 86/0251; H10D 86/80

See application file for complete search history.

(56) References Cited

U.S. PATENT DOCUMENTS

| | | | | |
|---|---|---|---|---|
| 11,114,470 | B2* | 9/2021 | Yamazaki | H01L 27/1225 |
| 11,183,600 | B2* | 11/2021 | Yamazaki | H01L 27/1225 |
| 11,189,736 | B2* | 11/2021 | Yamazaki | H10D 30/6734 |
| 11,195,758 | B2* | 12/2021 | Yamazaki | H10D 84/038 |
| 11,245,040 | B2* | 2/2022 | Yamazaki | H01L 29/7869 |
| 11,296,233 | B2* | 4/2022 | Yamazaki | H10D 64/517 |
| 11,316,051 | B2* | 4/2022 | Yamazaki | H10D 30/031 |
| 12,046,604 | B2* | 7/2024 | Yamazaki | G02F 1/133345 |
| 2016/0204129 | A1 | 7/2016 | Hoentschel et al. | |
| 2020/0098926 | A1 | 3/2020 | Sharma et al. | |
| 2020/0357929 | A1 | 11/2020 | Le et al. | |
| 2020/0373433 | A1* | 11/2020 | Yamazaki | H01L 29/66969 |
| 2020/0381565 | A1* | 12/2020 | Yamazaki | H01L 29/7869 |
| 2023/0251540 | A1* | 8/2023 | Tanaka | G02F 1/1345 349/46 |

OTHER PUBLICATIONS

Noh, et al., "Role of Hydrogen in Active Layer of Oxide-Semiconductor-Based Thin Film Transistors," Crystals, Jan. 31, 2019. 7 pages.
Extended European Search Report received for EP application No. 22184022.6, dated Dec. 21, 2022. 9 pages.

* cited by examiner

FIG. 5

GATE DIELECTRIC FOR THIN FILM OXIDE TRANSISTORS

FIELD OF THE DISCLOSURE

The present disclosure relates to integrated circuits, and more particularly, to oxide thin film transistors.

BACKGROUND

Thin film transistors (TFTs) are a class of field-effect transistors (FETs). A TFT generally includes a gate electrode, a gate dielectric layer, a semiconductor channel layer, and source and drain electrodes. An oxide TFT is one type of TFT, in which the semiconductor channel layer is a metal oxide semiconductor. TFTs can be front-gated, back-gated, or both front-gated and back-gated (sometimes called dual-gate TFT). An application of TFT technology is an amplifier in backlit displays (e.g., liquid crystal displays, LCDs), but TFTs are also advantageous in other applications. There are a number of non-trivial issues associated with TFTs.

As will be appreciated, the figures are not necessarily drawn to scale or intended to limit the present disclosure to the specific configurations shown. For instance, while some figures generally indicate perfectly straight lines, right angles, and smooth surfaces, an actual implementation of an integrated circuit structure may have less than perfect straight lines, right angles, and some features may have surface topology or otherwise be non-smooth, given real world limitations of the processing equipment and techniques used. Likewise, while the thickness of a given first layer may appear to be similar in thickness to a second layer, in actuality that first layer may be much thinner or thicker than the second layer; same goes for other layer or feature dimensions.

DETAILED DESCRIPTION

Thin film transistor (TFTs) structures are disclosed. Although the TFT structures can be used in any number of applications, they are particularly useful in applications involving sustained operation at high temperatures or other applications where transistors having a temperature-stable threshold voltage ($V_t$) are helpful. One example embodiment includes a zirconium-containing crystalline high-K dielectric layer in the thin film transistor. In one example case, a thin film transistor includes a gate electrode, a gate dielectric layer on the gate electrode and comprising zirconium and oxygen, and a channel layer on the gate dielectric layer. In some such cases, the gate dielectric layer further includes hafnium. In operation, hydrogen from the channel layer gradually diffuses through the zirconium-containing crystalline gate dielectric layer and effectively collects at the interface between the gate electrode and gate dielectric layer. Note that the hydrogen is detectable at that interface. Such zirconium-containing crystalline gate dielectric layers can be used, for example, to improve time-dependent dielectric breakdown (TDDB) performance, in that the TFT can handle larger voltage for a longer period of time, relative to standard TFTs such as those that include a hafnium oxide gate dielectric, according to some embodiments. In some cases, a metal oxide layer (e.g., an oxide native to gate fill metal) is present between the gate electrode and the gate dielectric layer, which may further help improve TDDB. The gate dielectric layer can be formed, for example, from alternating layers of hafnium oxide and hafnium zirconium oxide that are then annealed to form the crystalline gate dielectric, according to an embodiment. In some cases, a rapid thermal annealing process is used as a low temperature back end process for producing a high-K dielectric layer comprising hafnium, zirconium, and oxygen. The techniques described herein can be used with any number of TFT transistor configurations, including back-gate TFTs, front-gate TFTs, and dual-gate TFTs.

General Overview

As previously noted above, thin film transistors give rise to a number of non-trivial challenges. For instance, standard thin film oxide transistors may typically have moderate to severe bias temperature instabilities at temperatures above 50° C. However, oxide TFTs used as memory selectors in embedded dynamic random access memory (DRAM) may be subjected to temperatures of up to 110° C. for applications such as system-on-chip devices in laptops, desktops, and handheld devices, and up to 150° C. for grade 0 automotive microcontroller applications. Such high temperature environments can cause degradation of standard oxide TFTs. In particular, oxide semiconductors such as indium gallium, zirconium oxide (IGZO) are prone to build-up of hydrogen impurity. Such hydrogen build-up is a primary actor for negative bias temperature instability (NBTI), causing a given TFT threshold voltage $V_t$ to shift positive in a non-recoverable manner. In some cases, NBTI causes a device to slow down until it no longer powers on. Hafnium oxide gate dielectrics can be used to improve performance in TFTs, as they have a high permittivity constant ($\varepsilon_0$). However, pure hafnium oxide dielectrics present the challenge that they require a relatively high annealing temperature (up to 1200° C.), which is far beyond what a rapid thermal or laser anneal can accomplish without damaging the low-K dielectrics and/or a copper-based interconnect.

Thus, techniques are disclosed for providing improved thin film transistors. Although the techniques can be used in any number of scenarios, they are particularly helpful when fabricating thin film transistors using a low temperature back end process, such as for memory and logic cells formed within a back end interconnect structure. Example benefits of a TFT that are configured with a high-K dielectric layer in accordance with some embodiments of the present disclosure include, for instance, higher resistance to temperature, higher maximum voltage capacity following high temperature stress, reduction in NBTI, and reduced hydrogen effects. As will be discussed in turn, the resulting high-K dielectric layer is configured to provide a conduit for hydrogen diffusion.

In some embodiments, a high-K dielectric layer is between an oxide semiconductor and an underlying back side gate electrode that includes, for instance, one or more titanium nitride layers. In some embodiments, layers of hafnium zirconium oxide and hafnium oxide are deposited and then formed into a crystallized layer using a rapid thermal annealing (RTA) process. The RTA process serves to diffuse the layers of hafnium zirconium oxide and hafnium oxide together into a crystallized structure.

As previously explained, hydrogen build-up in the oxide semiconductor is a primary actor for negative bias temperature instability (NBTI) causing threshold voltage $V_t$ to shift positive for the device in a non-recoverable manner and in some cases to the point of device failure. Thus, reducing NBTI provides a device configured for longer life. A gate dielectric comprising hafnium zirconium oxide eliminates or otherwise reduces negative effects from hydrogen buildup by providing a conduit via grain boundaries through the crystalline gate dielectric structure, such that hydrogen tends to diffuse from the oxide semiconductor to the metal/oxide interface between the gate dielectric and gate electrode, thus enabling the TFT device to last longer (e.g., decades longer). In some embodiments, hydrogen builds-up over time at the interface between the electrode and a dielectric layer. In some embodiments, the TFT device further includes a metal oxide layer (e.g., titanium oxide layer) between the gate dielectric and the gate electrode. In some such cases, hydrogen builds-up at the interface between the gate electrode and the metal oxide layer. The metal oxide layer may include, for instance, oxygen and the same metal as used in the gate electrode. In any such cases, hydrogen migration occurs from the oxide semiconductor through the crystalline gate dielectric structure toward the gate electrode. A fixed buildup of hydrogen occurs in stasis at the boundary of the electrode and the gate dielectric. Note that the hydrogen does not move back, for example, when power is removed.

In some embodiments, the improvement in NBTI is accomplished, in part, because a gate dielectric comprising hafnium zirconium oxide provides a large operating temperature window with high reliability. The temperature window can be extended significantly, as NBTI is reduced. In some embodiments, for example, the operating temperature window can be extended up to 110° C., up to 120° C., up to 130° C., up to 140° C., or up to 150° C. In some embodiments, a gate dielectric comprising hafnium zirconium oxide provides reduced MOS capacitor threshold voltage over time, reduced operating temperatures, and longer life. In some embodiments, gate dielectrics comprising hafnium, zirconium, and oxygen provide resistance to threshold voltage shift. In some embodiments, gate dielectrics comprising hafnium, zirconium, and oxygen provides a near zero shift in threshold voltage following high temperature stress. In some embodiments, use of a zirconium-containing gate dielectric provides hysteresis improvement (reduced hysteresis effect).

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting).

The terms "left," "right," "front," "back," "top," "bottom," "over," "under," and the like in the description and in the claims, if any, are used for descriptive purposes and not necessarily for describing permanent relative positions. The terms "over," "under," "between," and "on" as used herein refer to a relative position of one component or material with respect to other components or materials where such physical relationships are noteworthy. For example, in the context of materials, one material or material disposed over or under another may be directly in contact or may have one or more intervening materials. Moreover, one material disposed between two materials or materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

Materials that are "compositionally different" or "compositionally distinct" as used herein refers to two materials that have different chemical compositions. This compositional difference may be, for instance, by virtue of an element that is in one material but not the other (e.g., SiGe is compositionally different than silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations. In still other embodiments, compositionally distinct materials may further refer to two materials that have different crystallographic orientations. For instance, (110) silicon is compositionally distinct or different from (100) silicon. Creating a stack of different orientations could be accomplished, for instance, with blanket wafer layer transfer.

Architecture

Figure 1A:
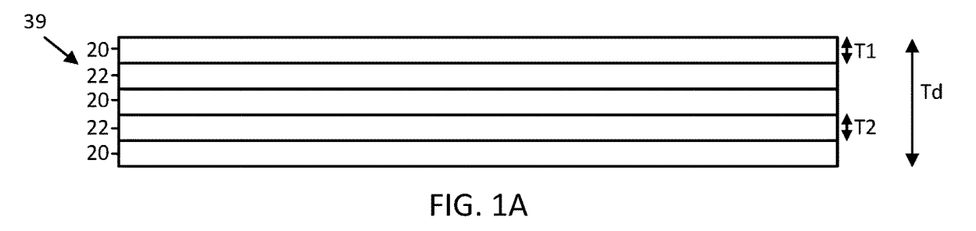
FIG. 1A illustrates a cross-sectional view of a layered gate dielectric prior to annealing, in accordance with some embodiments of the disclosure.

Turning now to the figures to illustrate various examples, FIG. 1A illustrates one embodiment of a gate dielectric 39 showing a layered configuration including five layers, prior to annealing to diffuse the multiple layers together to form an overall crystalline layer or structure, according to an embodiment. The configuration of layers may vary from one embodiment to the next.

In some examples, the pre-anneal gate dielectric 39 may include less than 20 layers, less than 10 layers, less than 5 layers, between 5 and 10 layers, between 10 and 15 layers, between 15 and 20 layers, or greater than 20 layers. The illustrated embodiment shows gate dielectric 39 comprising alternating layers 20 and 22. In some example embodiments, layer 20 comprises one or more of hafnium, zirconium, and oxygen, and layer 22 comprises one or more of hafnium and oxygen. In one such example case, layer 20 comprises hafnium, zirconium, and oxygen (hafnium zirconium oxide), and layer 22 comprises hafnium and oxygen (hafnium oxide). In another such example case, layer 20 comprises zirconium and oxygen (zirconium oxide), and layer 22 comprises hafnium and oxygen (hafnium oxide). In still other example embodiments, each layer 20 and 22 includes hafnium, zirconium, and oxygen. In some such example cases, layer 20 may include a higher percentage of hafnium, and layer 22 may include higher percentage of zirconium, or vice-versa.

In some embodiments, the thickness of a single layer of hafnium zirconium oxide, T1, may have a thickness of between 4 Å (angstrom) and 10 Å, between 4.5 Å and 8 Å, between 5 Å and 6 Å, or between 5 Å and 60 Å. In some embodiments, the thickness of a single layer of hafnium oxide, T2, may have a thickness of between 4 Å and 10 Å, between 4.5 Å and 8 Å, between 5 Å and 6 Å, or between 5 Å and 60 Å. In some embodiments, the overall thickness of the dielectric, Td, may include a single layer of hafnium zirconium oxide, or may include between 2 and 15, between 15 and 30, between 8 and 12, between 5 and 7, or between 15 and 20 stacked layers of hafnium zirconium oxide and hafnium oxide. In some embodiments, the thickness of the dielectric, Td, may have a thickness of between 40 Å and 100 Å, between 45 Å and 80 Å, between 50 Å and 60 Å. In some embodiments, Td comprises a silicon equivalent oxide thickness (EOT).

Figure 1B:
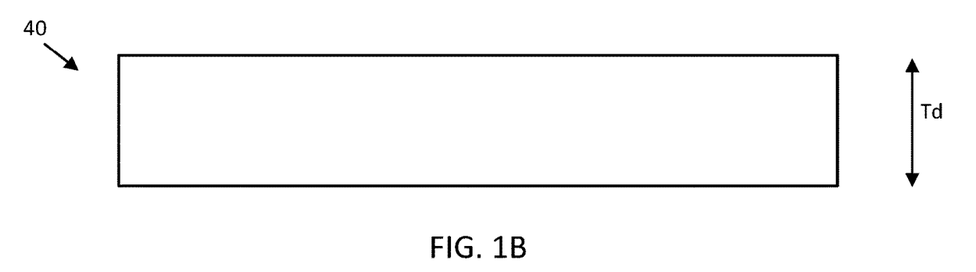
FIG. 1B illustrates a cross-sectional view of the layered gate dielectric of FIG. 1A after annealing, in accordance with some embodiments of the disclosure.

FIG. 1B illustrates one embodiment of a gate dielectric that results after the gate dielectric 39 having the layered configuration is annealed to diffuse the multiple layers together to form an overall crystalline dielectric layer or structure 40, according to an embodiment. As can be seen, the overall thickness Td of the annealed structure 40 is about the same as the pre-annealed structure 39, according to an embodiment.

In some embodiments, the dielectric structure 40 is a high-K dielectric layer including zirconium and at least one other high-K dielectric material, along with one or more of oxygen, nitrogen and carbon. In some such embodiments, portions of layers 20 and 22 may include one or more of: hafnium oxide, aluminum oxide, tantalum oxide, titanium dioxide, silicon nitride, silicon oxynitride, silicon dioxide, silicon aluminum oxide, hafnium silicon oxide, hafnium aluminum oxide, aluminum nitride, zirconium oxide, hafnium zirconium oxide, zirconium aluminum oxide, yttrium oxide, lanthanum oxide, hafnium yttrium oxide, hafnium lanthanum oxide, silicon oxycarbide, silicon aluminum carbide, silicon carbide, silicon aluminum nitride, hafnium titanium oxide, and aluminum titanium oxide. In some such embodiments, the resulting dielectric structure 40 includes zirconium and one or more of: hafnium, silicon, aluminum, tantalum, titanium, yttrium, and lanthanum, along with one or more of oxygen, nitrogen and carbon.

Figure 2A:
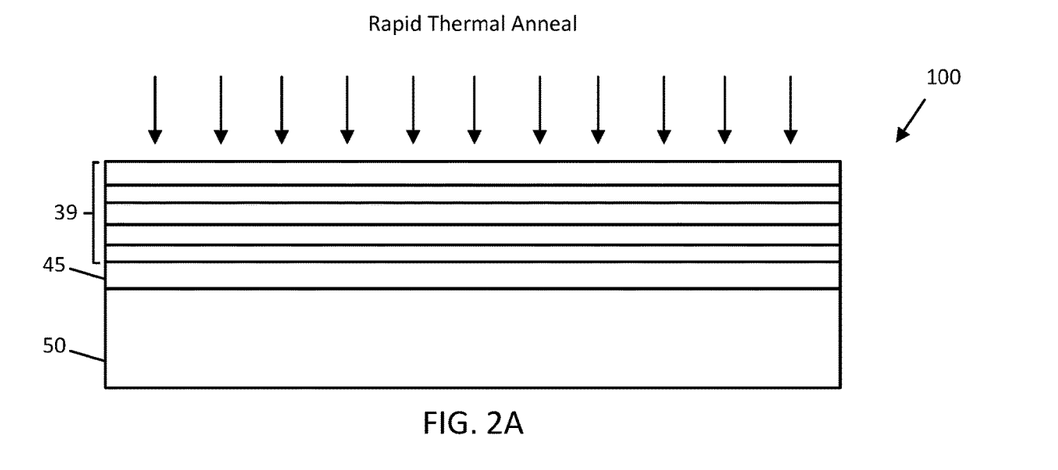
FIGS. 2A-C illustrate a cross-sectional view of a thin film transistor, in accordance with some embodiments of the disclosure.
Figure 2B:
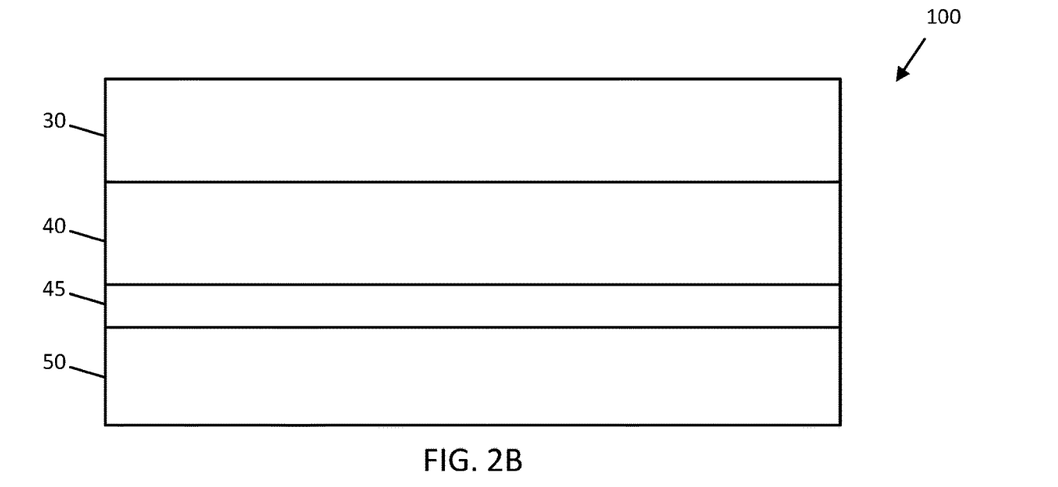
Figure 2C:
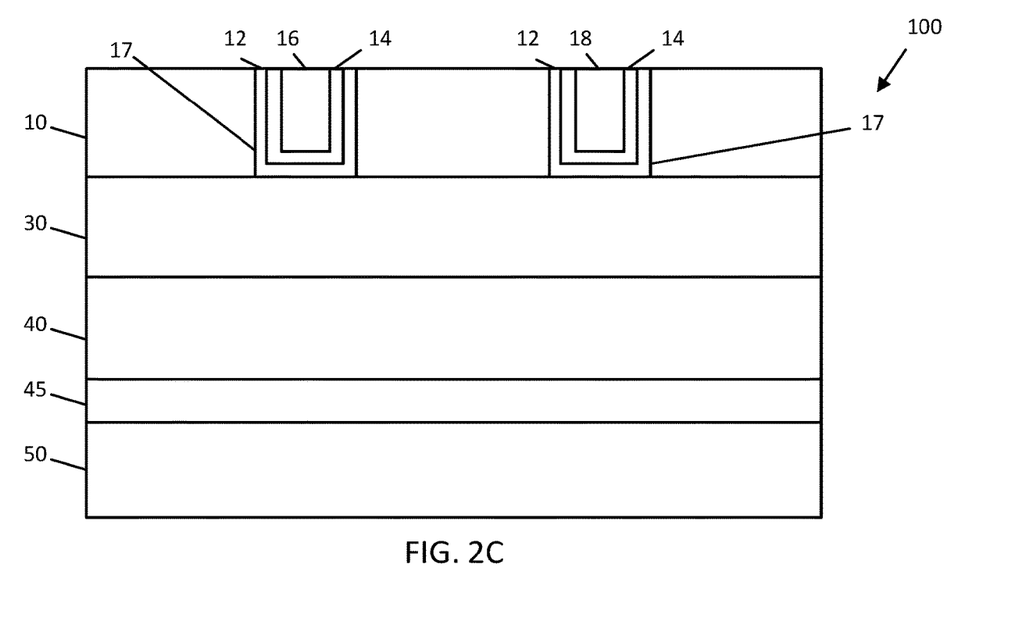

FIGS. 2A-C illustrate cross-sectional views of thin film transistor 100 at various stages of the formation process, in accordance with some embodiments of the disclosure. In this example, thin film transistor 100 is back-gated, but in other embodiments may be front-gated or dual-gated.

As can be seen in FIG. 2A, thin film transistor 100 comprises gate electrode 50, with layer 45 on gate electrode 50. In some embodiments, layer 45 comprises titanium and oxygen, although other metal oxides can be used, as previously explained (e.g., oxide of the metal included in gate electrode 50). In some embodiments, gate electrode 50 includes one or more of: titanium, nitrogen, tantalum, tungsten, carbon, platinum, chromium, hafnium, iridium, ruthenium, molybdenum, cobalt, indium, oxygen, aluminum, zinc, copper, or gold. Each of these metals or metallic compounds may be associated with a particular work function (or metal-semiconductor work function difference) that has an impact transistor threshold voltage $V_t$. A structure 39 of one or more layers that will ultimately form gate dielectric 40 on layer 45. In some embodiments, the one or more layers include alternating layers of hafnium zirconium oxide and hafnium oxide, although other layer configurations can be used as previously explained, and that discussion is equally applicable here. In some embodiments, the one more or more individual layers of structure 39 are formed using atomic layer deposition (ALD). As can be further seen, the structure 39 is subjected to a rapid thermal annealing process, which results in the formation of a crystalline gate dielectric 40 shown in FIG. 2B.

As can be further seen in FIG. 2B, a third layer comprising semiconductor 30 is deposited on gate dielectric 40. In some embodiments, semiconductor 30 is an oxide semiconductor. In some embodiments, semiconductor 30 comprises one or more of group III-V metals and/or group IV material, such as IGZO, titanium oxide ($TiO_2$), zinc oxide (ZnO), aluminum oxide ($Al_2O_3$). In some embodiments, the second layer comprising semiconductor 30 is amorphous.

As can be further seen in FIG. 2C, TFT 100 includes a source contact and a drain contact. In particular, a fourth layer including an insulator or hard mask layer 10 is deposited on semiconductor 30. In some embodiments, layer 10 comprises nitride (e.g., silicon nitride, silicon oxynitride, silicon oxycarbonitride). Layer 10 may include any number of suitable materials and configurations. Trenches 17 are etched in layer 10. Liner 12 is deposited along the border of trench 17. In some embodiments, liner 12 is in contact with semiconductor 30 at a lower edge of layer 10 and in contact with layer 10 along the side edges of trench 17. In some embodiments, liner 12 comprises one or more of indium, gallium, zinc, oxygen, and indium gallium zinc oxide (IGZO). Liner 12 may include any number of suitable materials and configurations. Metal seed layer 14 is sputtered or otherwise deposited on liner 12. In some embodiments, metal seed layer comprises copper. Metal seed layer 14 may include any number of suitable materials and configurations. Source contact 16 and drain contact 18 are formed by electroplating to fill in trench 17. In some embodiments, source contact 16 and drain contact 18 comprise copper. Source contact 16 and drain contact 18 may include any number of suitable materials and configurations.

Figure 2D:
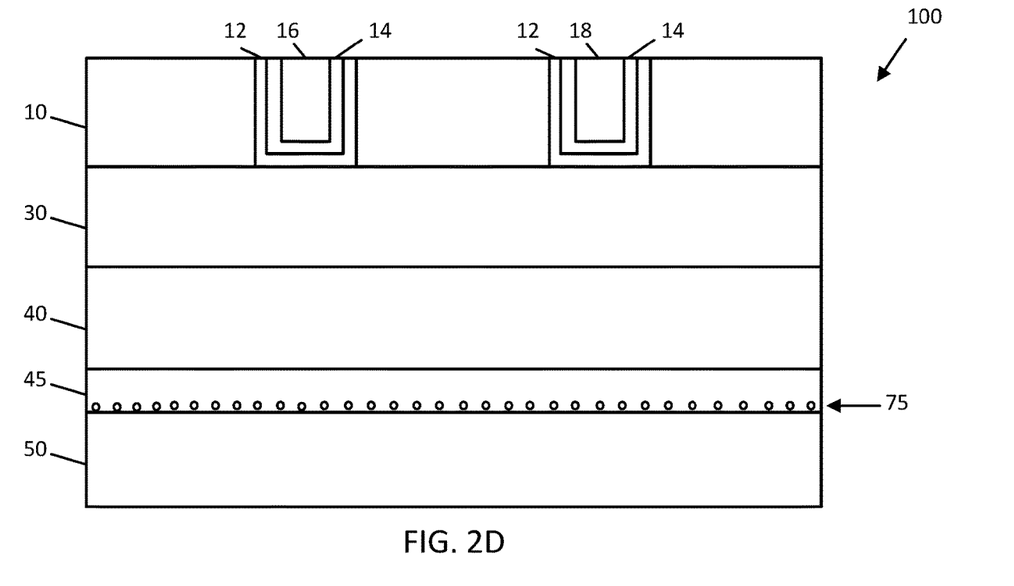
FIGS. 2D-F illustrate a cross-sectional view of a thin film transistor, in accordance with some embodiments of the disclosure.

FIG. 2D illustrates thin film transistor 100 during use or following use. As can be seen at 75, thin film transistor 100 includes hydrogen that has diffused or otherwise migrated from layer 30, through crystalline layer 40 and layer 45, to the interface of the layer 45 and electrode 50. Gate dielectric 40 provides a pathway for hydrogen diffusion from semiconductor 30 toward electrode 50. The buildup of hydrogen at 75 aids in promoting longer TFT lifetimes with higher reliability (see FIGS. 3A-B). Note that 75 can be thought of as a layer or location or portion within layer 45, that includes hydrogen.

Figure 2E:
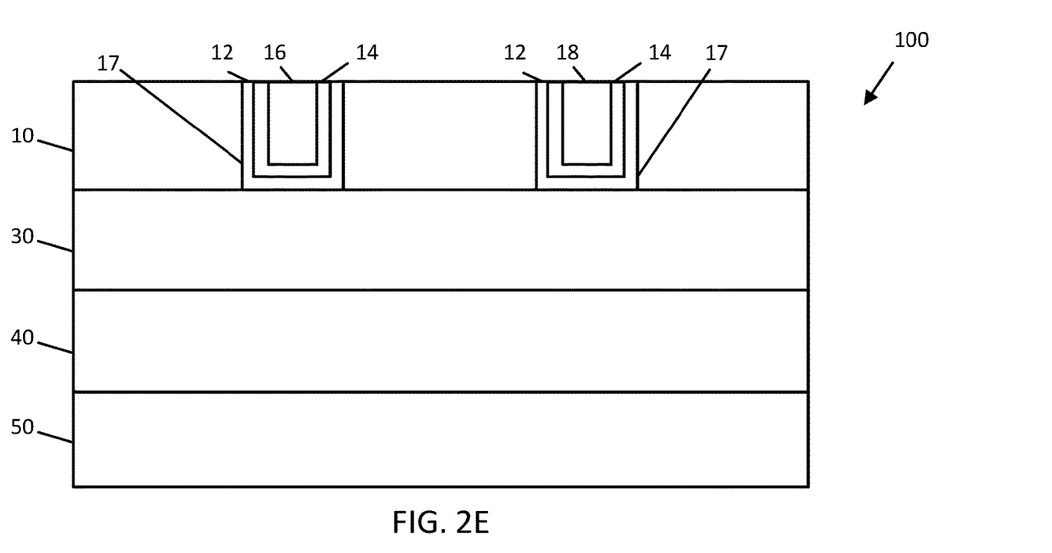
Figure 2F:
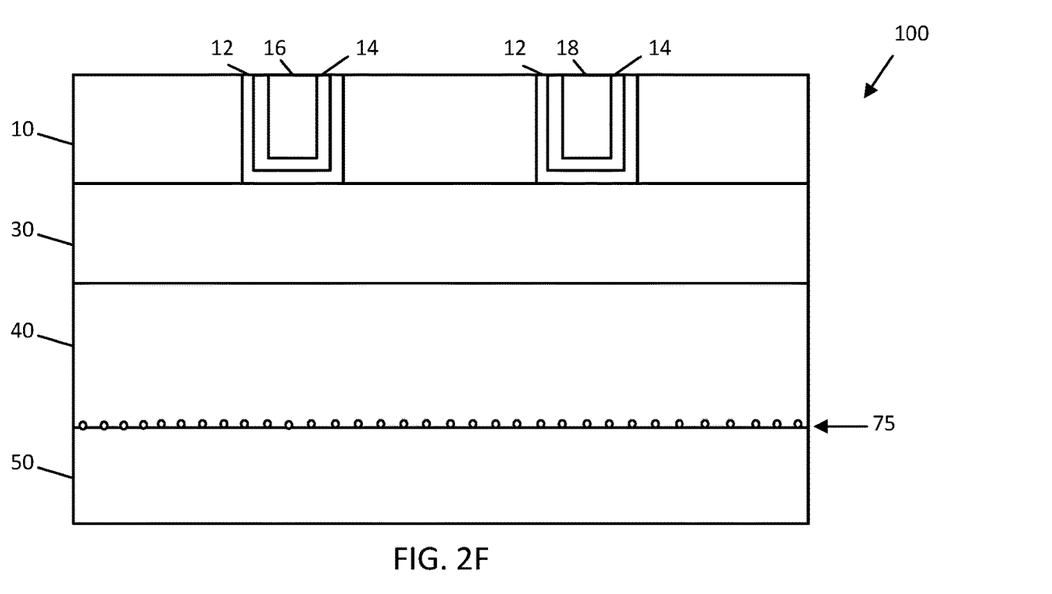

FIGS. 2E-F illustrate cross-sectional views of thin film transistor 100, in accordance with another embodiment of the disclosure. As can be seen, the thin film transistors 100 of FIGS. 2E-F are similar to the thin film transistors 100 of FIGS. 2C-D, except that the thin film transistors 100 of FIGS. 2E-F don't include layer 45. Thus, gate dielectric 40 is formed on gate electrode 50. The previous relevant discussion is equally applicable here. FIG. 2F illustrates thin film transistor 100 during use or following use. As can be further seen at 75, thin film transistor 100 includes hydrogen deposited at an interface of gate dielectric 40 and gate electrode 50. Gate dielectric 40 provides a pathway for hydrogen diffusion from semiconductor 30 toward electrode 50. The buildup of hydrogen at 75 aids in promoting longer TFT lifetimes with higher reliability (see FIGS. 3A-B). In this example case, note that 75 can be thought of as a layer or location or portion within gate dielectric 40, that includes hydrogen.

In some embodiments, thin film transistors 100 may be stacked and repeated in several layers. In one specific example, thin film transistors 100 may be stacked in tens to hundreds of layers (e.g., 128 layers). In some embodiments, TFTs 100 are used in back end memory cells or back end logic cells. In other embodiments, TFTs 100 are used in the device layer of a given integrated circuit. In a more general sense, TFTs 100 can be used in any number of integrated circuit applications.

Figure 3A:
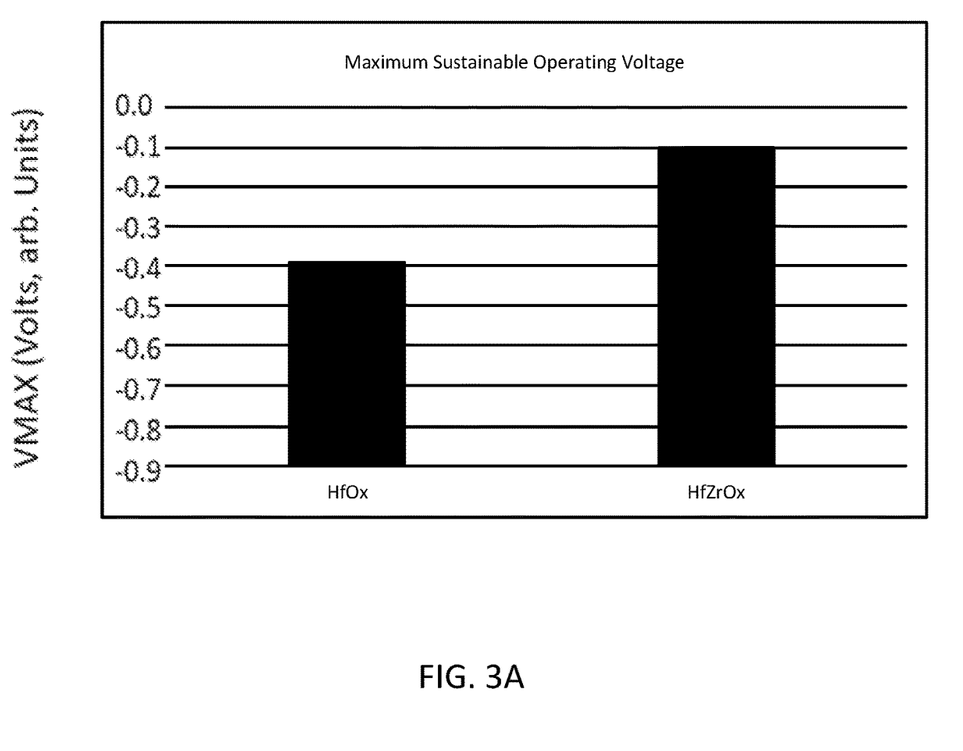
FIG. 3A is a graphical illustration of maximum sustainable operating voltage for hafnium oxide compared to hafnium zirconium oxide, in accordance with some embodiments of the disclosure.

FIG. 3A is a graphical illustration of maximum sustainable operating voltage for hafnium oxide compared to hafnium zirconium oxide, in accordance with some embodiments of the present disclosure. Time dependent gate oxide breakdown (TDDB) is one measure of transistor aging which examines breakdown of the gate oxide as a result of long-time application of relatively low electric field. The breakdown is caused by formation of a conducting path through the gate dielectric to substrate due to electron tunneling current, when MOSFETs are operated close to or beyond their specified operating voltages. As can be appreciated from FIG. 3A, the measured maximum operating voltage (−0.1 volts, arb. units) for hafnium zirconium oxide is higher as compared to the measured maximum operating voltage for hafnium oxide that does not contain zirconium (approximately −0.4 volts, arb. units). Note that the voltage values are provided as normalized, arbitrary units. Thus, the gate dielectric comprising hafnium zirconium oxide yields a higher operating voltage, indicating a change in the formation of a conducting path. In the graphical illustration shown in FIG. 3A, the gate dielectric comprising hafnium zirconium oxide yields a 0.3 volt (arb. units) higher operating voltage, indicating a change in the formation of a conducting path. In some embodiments, the change in formation of a conducting path is a lack of formation of a conducting path. In some embodiments, the change in formation of a conducting path is a reduced formation of a conducting path. The change in formation of a conducting path results from several factors. In some embodiments, the improvement resulting from using hafnium zirconium oxide in the gate dielectric results from inhibiting or otherwise reducing hydrogen buildup within the oxide semiconductor channel layer and any performance breakdown resulting from hydrogen buildup. In some embodiments, the improvement in TDDB may further be driven by layer 45 comprising titanium oxide (or some other metal oxide, such as an oxide native to the gate fill metal). As described above, a gate dielectric comprising hafnium zirconium oxide provides a conduit for hydrogen diffusion after it is crystallized using a rapid thermal annealing process.

Figure 3B:
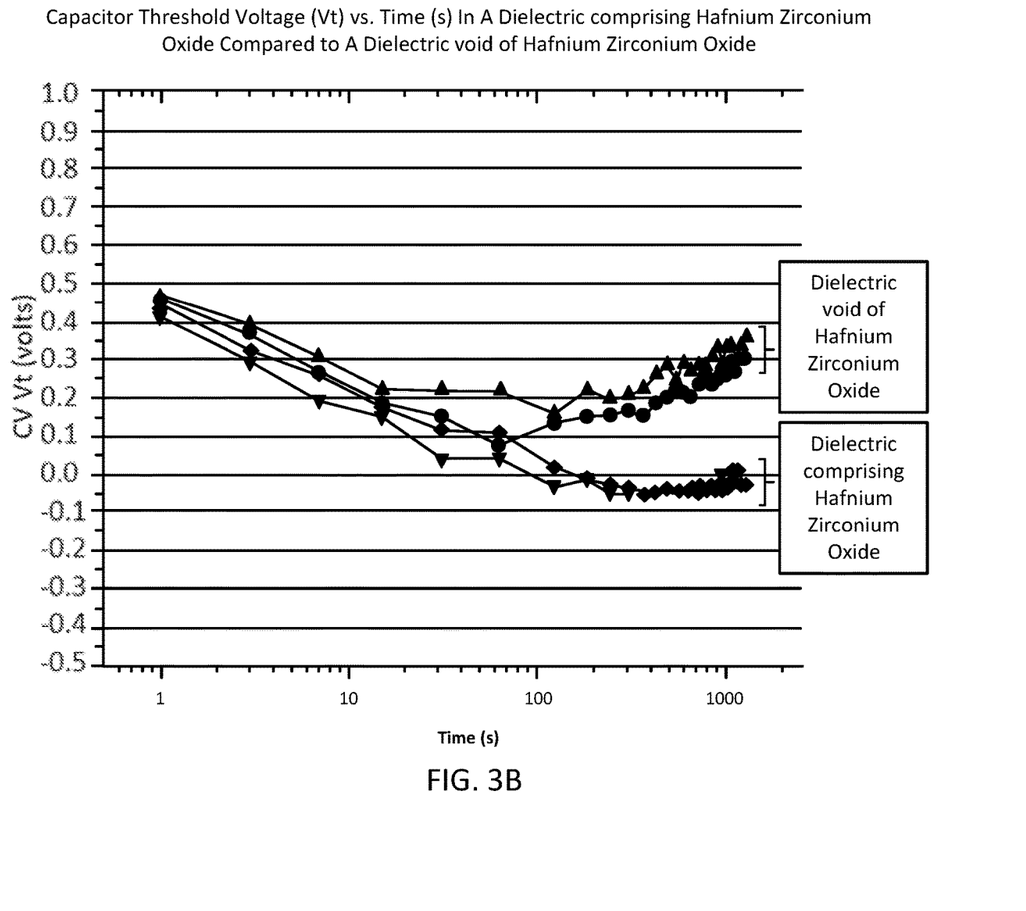
FIG. 3B is a graphical illustration of transistor threshold voltage across a capacitor over time, in accordance with some embodiments of the disclosure.

FIG. 3B is a graphical illustration of threshold voltage across a capacitor over time, in accordance with some embodiments of the disclosure. Note that the threshold voltage values are provided as normalized, arbitrary units. The plots indicated with diamonds and upside-down triangles represent a dielectric comprising hafnium zirconium oxide. The log time scale on the x-axis shows that threshold voltage remains low over time for a dielectric which includes one or more layers of hafnium zirconium oxide. The plots indicated with upright triangles and circles represent a dielectric void of hafnium zirconium oxide. Without one or more layers of hafnium zirconium oxide according to an embodiment, as shown, threshold voltage across the capacitor increases over time causing breakdown in operation.

Figure 4A:
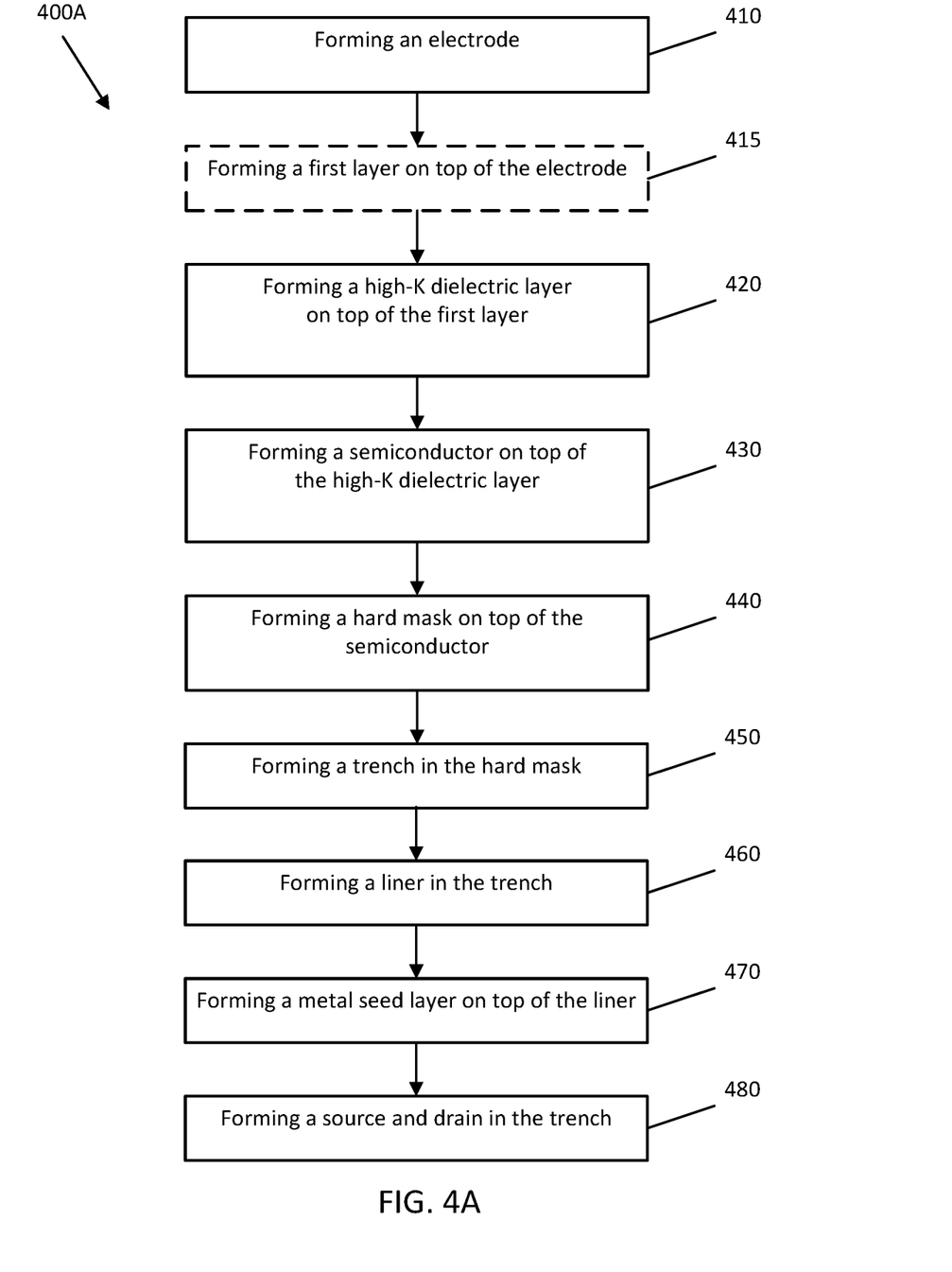
FIG. 4A illustrates a flow diagram illustrating a method for fabricating a thin film transistor, in accordance with some embodiments of the disclosure.

FIG. 4A illustrates a method 400A for fabricating a gate dielectric for a thin film oxide transistor, in accordance with some embodiments. Method 400A begins at 410 which includes forming an electrode 50. In some embodiments, the electrode 50 is a polished metal nitride electrode. At 415, the method 400A continues with forming first layer 45 on top of electrode 50 (see FIG. 2A). In some embodiments, first layer 45 comprises titanium and oxygen. In some embodiments first layer 45 comprises titanium oxide. In some embodiments, first layer 45 is formed using one of atomic layer deposition (ALD) or chemical vapor deposition (CVD). At 420, the method 400A continues with forming high-K dielectric layer 40 on top of first layer. In some embodiments, one or more individual layers of hafnium zirconium oxide and hafnium oxide are deposited using one of ALD or CVD on top of first layer 45 (see FIG. 1A). In some such embodiments, following deposition using atomic layer deposition, the multilayer structure is annealed via a rapid thermal annealing (RTA) process, thereby forming high-K dielectric layer 40. In some embodiments, the RTA process used is a low temperature anneal. In some embodiments, the RTA process occurs at temperatures between 400° C. and 600° C., between 500° C. and 600° C., between 400° C. and 500° C., or less than 600° C. In some embodiments, the RTA process occurs for a period of less than 5 minutes, less than 4 minutes, less than 3 minutes, less than 2 minutes, less than 1 minute, between 30 seconds and 2 minutes, or between 2 minutes and 5 minutes. In some embodiments, annealing using an RTA process results in crystallization of the high-K dielectric layer. At 430, the method 400A continues with forming a semiconductor on top of the high-K dielectric layer. In some embodiments, step 430 includes sputtering or atomic layer deposition of an oxide semiconductor 30.

At 440, the method 400A continues with forming a layer comprising a hard mask or insulator material on top of the semiconductor. At 450, the method 400A continues with forming source and drain contact trenches in the hard mask or insulator layer. At 460, the method 400A continues with forming a liner in the trenches. In some embodiments, the liner may be deposited on a lower portion of the trench adjacent to the semiconductor as well as along the sides of the trench adjacent to the hard mask. At 470, the method 400A continues with forming a metal seed layer on top of the liner in the trench. In some embodiments, the metal seed layer is formed along a bottom portion of the trench over the liner as well as along side portions of the trench over the liner. At 480, the method 400A continues with depositing fill metal into the trench and on the seed layer, to fill any remaining portion of the trenches. In some embodiments, the fill metal is provisioned by electroplating.

Figure 4B:
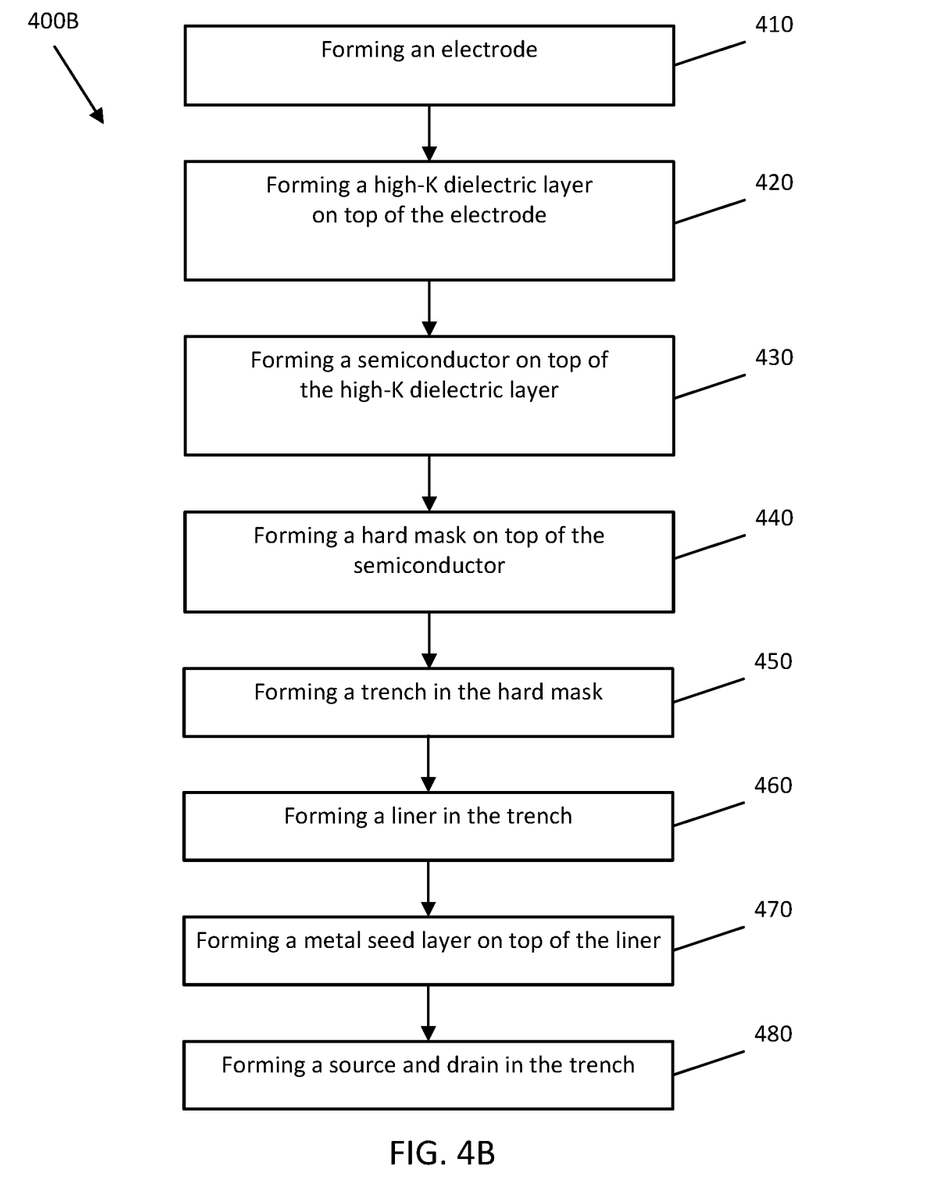
FIG. 4B illustrates a flow diagram illustrating a method for fabricating a thin film transistor, in accordance with some embodiments of the disclosure.

FIG. 4B illustrates a method 400B for fabricating a gate dielectric for a thin film oxide transistor, in accordance with some embodiments. Method 400B begins at 410 which includes forming an electrode 50. In some embodiments, the electrode 40 is a polished metal nitride electrode. At 420, the method 400B continues with forming a high-K dielectric layer 40 on top of the electrode 50 (see FIG. 2B). In some embodiments, one or more individual layers of hafnium zirconium oxide and hafnium oxide are deposited using one of ALD or CVD on top of electrode 50 (see FIG. 1). In some embodiments, following deposition, high-K dielectric layer 40 is annealed via a rapid thermal annealing (RTA) process. In some embodiments, the RTA process used is a low temperature anneal. In some embodiments, the RTA process occurs at temperatures between 400° C. and 600° C., between 500° C. and 600° C., between 400° C. and 500° C., or less than 600° C. In some embodiments, the RTA process occurs for a period of less than 5 minutes, less than 4 minutes, less than 3 minutes, less than 2 minutes, less than 1 minute, between 30 seconds and 2 minutes, or between 2 minutes and 5 minutes. In some embodiments, annealing using an RTA process results in crystallization of the high-K dielectric layer. At 430, the method 400B continues with forming a semiconductor on top of the high-K dielectric layer. In some embodiments, step 430 includes sputtered or atomic layer deposition of an oxide semiconductor 30.

At 440, the method 400B continues with forming a layer comprising a hard mask or insulator material on top of the semiconductor. At 450, the method 400B continues with forming a trench in the hard mask or insulator layer. At 460, the method 400B continues with forming a liner in the trench. In some embodiments, the liner may be deposited on a lower portion of the trench adjacent to the semiconductor as well as along the sides of the trench adjacent to the hard mask. At 470, the method 400B continues with forming a metal seed layer on top of the liner in the trench. In some embodiments, the metal seed layer is formed along a bottom portion of the trench over the liner as well as along side portions of the trench over the liner. At 480, the method 400A continues with depositing fill metal into the trench and on the seed layer, to fill any remaining portion of the trenches. In some embodiments, the fill metal is provisioned by electroplating.

Embodiments as described herein are compatible with a copper dual damascene process or a copper single damascene process for chip fabrication. In some embodiments, the low temperature rapid thermal annealing process as described herein is a back-end process. In some embodiments, the low temperature rapid thermal annealing process is configured to maintain the electromigration properties of copper.

Computing System

Figure 5:
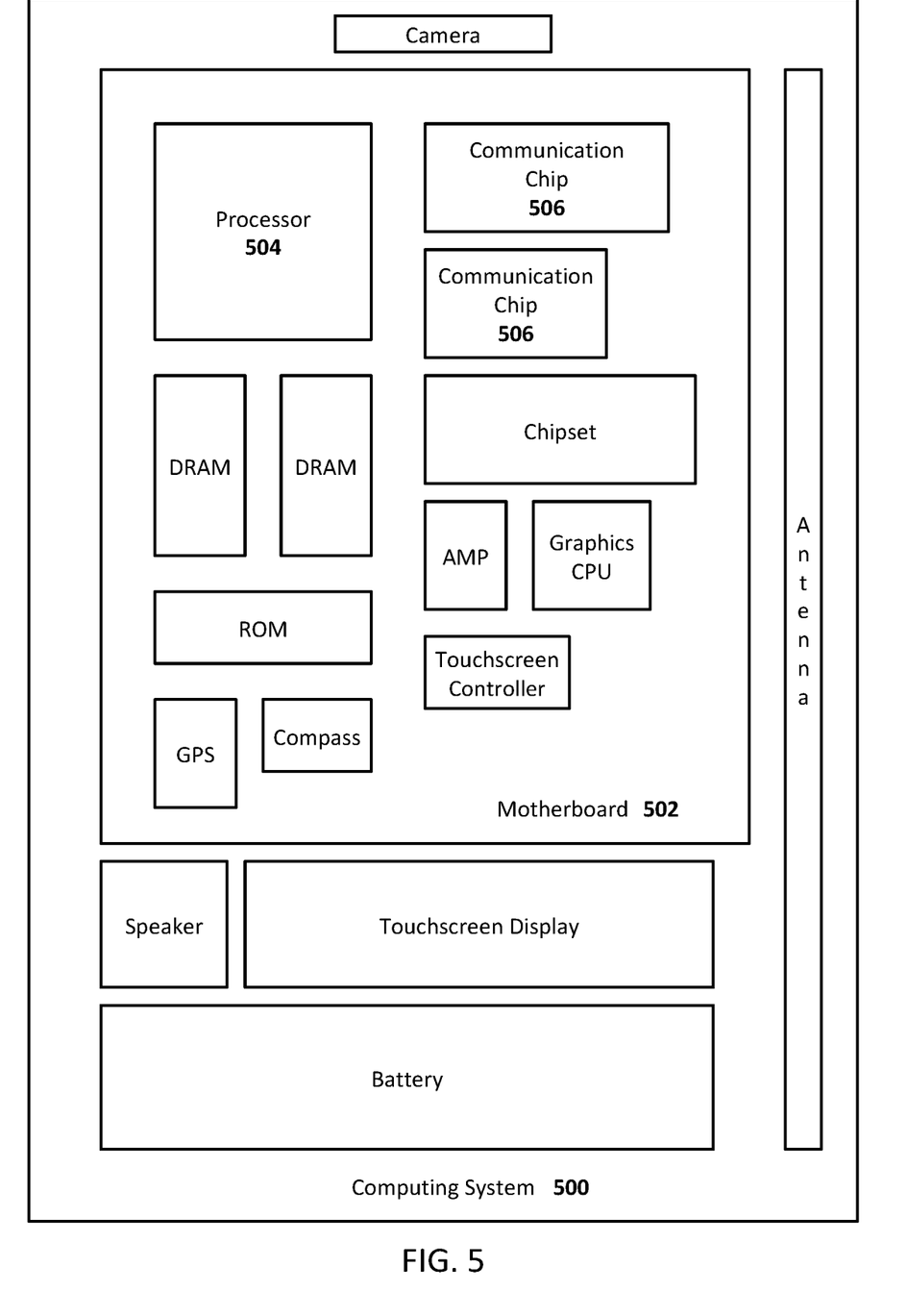
FIG. 5 illustrates a computing system implemented with one or more integrated circuit structures configured in accordance with an embodiment of the present disclosure.

FIG. 5 illustrates a computing system implemented with one or more integrated circuit structures configured in accordance with an embodiment of the present disclosure. As can be seen, the computing system 500 houses a motherboard 502. The motherboard 502 may include a number of components, including but not limited to a processor 504 and at least one communication chip 506 (two are shown in this example), each of which can be physically and electrically coupled to the motherboard 502, or otherwise integrated therein. As will be appreciated, the motherboard 502 may be, for example, any printed circuit board, whether a main board or a daughterboard mounted on a main board or the only board of system 500, etc. Depending on its applications, computing system 500 may include one or more other components that may or may not be physically and electrically coupled to the motherboard 502. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 500 may include one or more integrated circuits configured with one or more instances of a TFT having a crystalline gate dielectric and hydrogen stacked up at the interface between the gate dielectric and gate electrode, as variously described herein. In some embodiments, multiple functions can be integrated into one or more chips (e.g., for instance, note that the communication chip 506 can be part of or otherwise integrated into the processor 504).

The communication chip 506 enables wireless communications for the transfer of data to and from the computing system 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others. The processor 504 of the computing system 500 includes an integrated circuit die packaged within the processor 504. In some example embodiments of the present disclosure, the integrated circuit die of the processor 504 includes one or more occurrences of a TFT structures as variously provided herein. The term "processor" may refer to any device or portion of a device that processes, for instance, electronic data from registers and/or memory to transform that electronic data into other electronic data that may be stored in registers and/or memory.

The communication chip 506 may also include an integrated circuit die packaged within the communication chip 506. In accordance with some such example embodiments, the integrated circuit die of the communication chip 506 includes one or more occurrences of a TFT structures as variously provided herein. As will be appreciated in light of this disclosure, note that multi-standard wireless capability may be integrated directly into the processor 504 (e.g., where functionality of any chips 506 is integrated into processor 504, rather than having separate communication chips). Further note that processor 504 may be a chip set having such wireless capability. In short, any number of processor 504 and/or communication chips 506 can be used. Likewise, any one chip or chip set can have multiple functions integrated therein.

In various implementations, the computing system 500 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the system 500 may be any other electronic device that processes data or employs one or more TFT structures as variously provided herein. As will be appreciated in light of this disclosure, various embodiments of the present disclosure can be used to improve performance on products fabricated at any process node (e.g., in the micron range, or sub-micron and beyond).

FURTHER EXAMPLE EMBODIMENTS

The following examples pertain to further embodiments, from which numerous permutations and configurations will be apparent.

Example 1 is an integrated circuit comprising: a gate electrode, a first layer comprising an oxide semiconductor material, a second layer between the first layer and the gate electrode, and in contact with the first layer, the second layer comprising zirconium and oxygen, wherein the second layer is crystalline, a first contact coupled to the first layer at a first location, and a second contact coupled to the first layer at a second location.

Example 2 includes the subject matter of Example 1, wherein the second layer further includes hafnium.

Example 3 includes the subject matter of Example 1 or 2, and further includes insulator material on the first layer, wherein the first and second contacts are in the insulator material.

Example 4 includes the subject matter of any one of Examples 1 through 3, wherein the first and second contacts include one, two or all three of: a fill material comprising a metal, a liner layer between the insulator material and the fill material, and a seed layer between the liner layer and the fill material, the seed layer comprising the metal.

Example 5 includes the subject matter of any one of Examples 1 through 4, wherein a thickness of the second layer is between 45 Å and 65 Å.

Example 6 includes the subject matter of any one of Examples 1 through 5, and further includes a third layer between of the gate electrode and the second layer, the third layer comprising a metal and oxygen.

Example 7 includes the subject matter of any one of Examples 1 through 6, wherein the gate electrode also comprises the metal.

Example 8 includes the subject matter of any one of Examples 1 through 7, wherein the metal is titanium and the gate electrode further includes nitrogen.

Example 9 includes the subject matter of any one of Examples 1 through 8, wherein hydrogen is present at an interface between the gate electrode and the second layer.

Example 10 includes the subject matter of any one of claims 1 through 9, wherein the thin film transistor is configured to operate at temperatures up to 150° C.

Example 11 includes the subject matter of any one of claims 1 through 10, wherein the oxide semiconductor material is an amorphous oxide semiconductor material.

Example 12 is an integrated circuit comprising: a gate electrode, a first layer on top of the gate electrode, the first layer comprising a dielectric including zirconium and oxygen, wherein the first layer is crystalline, a second layer on top of the first layer, the second layer comprising a semiconductor, and a third layer over the second layer, the third layer including insulator a source contact and a drain contact.

Example 13 includes the subject matter of Example 12, wherein the dielectric further includes hafnium.

Example 14 includes the subject matter of Example 12 or 13, wherein a thickness of the first layer is between 45 Å and 80 Å.

Example 15 includes the subject matter of any one of Examples 12 through 14, wherein the gate electrode comprises a metal, and the integrated circuit further comprises a layer between the gate electrode and the first layer, the layer comprising the metal and oxygen.

Example 16 includes the subject matter of any one of Examples 12 through 15, wherein hydrogen is present at an interface between the gate electrode and the first layer.

Example 17 is a method for fabricating a thin film transistor comprising: forming an electrode, forming one or more layers including zirconium and oxygen on the electrode, forming a crystalline layer on the electrode from the one or more layers using a rapid thermal annealing process, the crystalline layer comprising a dielectric including zirconium and oxygen, and forming a second layer comprising a semiconductor on the crystalline layer.

Example 18 includes the subject matter of Example 17, wherein the one or more layers further includes hafnium and the dielectric further includes hafnium.

Example 19 includes the subject matter of Example 17 or 18, and further includes forming a metal oxide layer comprising titanium and oxygen between the electrode and the crystalline layer.

Example 20 includes the subject matter of any one of Examples 17 through 19, wherein a thickness of the crystalline layer is between 45 Å and 80 Å.

Example 21 includes the subject matter of any one of Examples 17 through 20, and further includes forming source and drain contacts on the second layer.

Example 22 includes the subject matter of any one of Examples 17 through 21, wherein the rapid thermal annealing process occurs at a temperature of less than 600° C.

Example 23 includes the subject matter of any one of Examples 17 through 22, wherein the rapid thermal annealing process occurs for less than 2 minutes.

The foregoing description of example embodiments of the present disclosure has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto.

What is claimed is:
1. A thin film transistor, comprising:
a gate electrode;
a first layer comprising an oxide semiconductor material;
a second layer between the first layer and the gate electrode, and in contact with the first layer, the second layer comprising zirconium and oxygen, wherein the second layer is crystalline, and wherein hydrogen has a local maximum concentration at an interface between the gate electrode and the second layer;
a first contact coupled to the first layer at a first location; and a second contact coupled to the first layer at a second location.

2. The thin film transistor of claim 1, wherein the second layer further includes hafnium.

3. The thin film transistor of claim 1, further comprising insulator material on the first layer, wherein the first and second contacts are in the insulator material.

4. The thin film transistor of claim 3, wherein the first and second contacts include one, two or all three of:
- a fill material comprising a metal;
- a liner layer between the insulator material and the fill material; and
- a seed layer between the liner layer and the fill material, the seed layer comprising the metal.

5. The thin film transistor of claim 1, wherein a thickness of the second layer is between 45 Å and 65 Å.

6. The thin film transistor of claim 1, wherein the thin film transistor is configured to operate at temperatures up to 150° C.

7. The thin film transistor of claim 1, wherein the oxide semiconductor material is an amorphous oxide semiconductor material.

8. The thin film transistor of claim 1, wherein the interface between the gate electrode and the second layer is along a bottom surface of the second layer, an interface between the first layer and the second layer is along a bottom surface of the first layer, the first contact is coupled to a top surface of the first layer, and the second contact is coupled to the top surface of the first layer.

9. An integrated circuit comprising:
- a gate electrode;
- a first layer on top of the gate electrode, the first layer comprising a metal and oxygen, wherein hydrogen is built up at an interface between the gate electrode and the first layer;
- a second layer on top of the first layer, the second layer comprising a dielectric including zirconium and oxygen, wherein the second layer is crystalline;
- a third layer on top of and in contact with the second layer, the third layer comprising a semiconductor material; and
- a fourth layer over the third layer, the fourth layer including an insulator, a source contact, and a drain contact.

10. The integrated circuit of claim 9, wherein the dielectric further includes hafnium.

11. The integrated circuit of claim 9, wherein a thickness of the second layer is between 45 Å and 80 Å.

12. The integrated circuit of claim 9, wherein the gate electrode comprises the metal of the first layer.

13. The integrated circuit of claim 12, wherein the metal is titanium and the gate electrode further includes nitrogen.

14. The integrated circuit of claim 9, wherein the third layer is an oxide semiconductor material.

15. The integrated circuit of claim 9, wherein the interface between the gate electrode and the first layer is along a bottom surface of the first layer, an interface between the first layer and the second layer is along a bottom surface of the second layer, and an interface between the third layer and the second layer is along a top surface of the second layer.

16. An integrated circuit, comprising:
- a gate electrode;
- a first layer comprising a semiconductor material;
- a second layer between the first layer and the gate electrode, and in contact with the first layer, the second layer comprising a crystalline high-k dielectric material, wherein hydrogen is stacked up at an interface between the gate electrode and the second layer;
- a first contact coupled to the first layer at a first location; and
- a second contact coupled to the first layer at a second location.

17. The integrated circuit of claim 16, wherein the second layer comprises zirconium and one or more of oxygen, nitrogen, or carbon.

18. The integrated circuit of claim 17, wherein the second layer further comprises one or more of hafnium, silicon, aluminum, tantalum, titanium, yttrium, or lanthanum.

19. The integrated circuit of claim 16, wherein the semiconductor material is an oxide semiconductor material.

20. The integrated circuit of claim 16, wherein the semiconductor material is amorphous.

* * * * *